(12) United States Patent
Yang et al.

(10) Patent No.: US 6,369,737 B1
(45) Date of Patent: Apr. 9, 2002

(54) METHOD AND APPARATUS FOR CONVERTING A LOW DYNAMIC RANGE ANALOG SIGNAL TO A LARGE DYNAMIC RANGE FLOATING-POINT DIGITAL REPRESENTATION

(75) Inventors: David Yang, Palo Alto; Abbas El Gamal, P. A.; Boyd Fowler, Sunnyvale, all of CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 08/960,823

(22) Filed: Oct. 30, 1997

(51) Int. Cl.$^7$ ................................................ H03M 1/12
(52) U.S. Cl. ........................................ 341/155; 341/169
(58) Field of Search .............................. 341/169, 155, 341/159, 161

(56) References Cited

U.S. PATENT DOCUMENTS 5,321,404 A * 6/1994 Mallinson et al. .......... 341/169
5,614,948 A   3/1997 Hannah

OTHER PUBLICATIONS

Nakamura, T. et al., Recent progress of CMD imaging, 1997 IEEE Workshop on Charge–Coupled Devices & Advanced Image Sensors, Bruges, Belgium, Jun. 5–7, 1997.
Yadid–Pecht, O et al., Wide intrascene dynamic range CMOS APS using dual sampling, IEEE Trans. Electron Devices, Oct. 1997.

* cited by examiner

*Primary Examiner*—Peguy JeanPierre
(74) *Attorney, Agent, or Firm*—Lumen Intellectual Property Services, Inc.

(57) ABSTRACT

An analog-to-digital conversion scheme allows the conversion of a small dynamic range analog signal into a floating-point, digital representation with a larger dynamic range. A montonically changing analog signal is reset to a reference value at time t=0. The analog signal is then sub-converted by an analog-to-digital converter with maximum input signal level $S_s$ to corresponding digital representations at several sub-conversion times $t=T_2>T_1 t=T_3>T_2, \ldots t=T_M>T_{M-1}$, where $T_M \leq T$. These digital representations are then suitably combined to produce a cumulative, floating-point digital representation which accurately represents the analog signal even if the analog signal has a value greater than $S_s$ at time t=T.

33 Claims, 9 Drawing Sheets

METHOD AND APPARATUS FOR CONVERTING A LOW DYNAMIC RANGE ANALOG SIGNAL TO A LARGE DYNAMIC RANGE FLOATING-POINT DIGITAL REPRESENTATION

FIELD OF THE INVENTION

This invention relates to analog-to-digital conversion and, in particular, to a method and apparatus for converting an analog signal of limited dynamic range to a large dynamic range, floating-point, digital representation.

BACKGROUND OF THE INVENTION

Integrating sensors are used in many applications to measure physical quantities. For example, photodiodes are often used as light sensors to measure the intensity of incident light. In such an application, the photodiode is configured to accumulate (integrate) charge that arises from electron-hole pair formation at the junction of the photodiode as light strikes the junction. The amount of charge that accumulates over a period of time is proportional to the intensity of the light impinging on the junction and, therefore, the accumulated charge can be used to quantify the intensity of the light.

For illustrative purposes, this application will only discuss integrating sensor systems used to measure light intensity. However, the methods and apparatus of both the prior art and the present invention apply equally well to integrating sensor systems in general, including those that are used to measure other physical quantities.

A simplified, typical, prior art integrating sensor system 10 is shown in FIG. 1. The system comprises a sensor 12, a reset switch 14, a sampling switch 16, a capacitor 18, an analog processing circuit 20 (such as an amplifier, buffer, or a simple conductor), and an analog-to-digital converter (ADC) 22. Sensor 12 provides an analog signal in response to an applied stimulus. The analog signal from sensor 12 is applied to a first terminal of reset switch 14 and to a first terminal of sampling switch 16. Reset switch 14 has a second terminal which connects to a reference voltage (e.g. the positive power supply). Sampling switch 16 has a second terminal which connects to a first terminal of capacitor 18 and also connects to an input terminal of analog processing circuit 20. Capacitor 18 has a second terminal connected to a reference voltage (e.g. ground), and analog processing circuit 20 has an output terminal is connected to an input terminal of ADC 22. ADC 22 has an output terminal for producing a digital output that corresponds to the analog signal at its input terminal. Although the system of FIG. 1 could be used in other applications to measure other physical quantities, let us assume that sensor 12 is a photodetector and that sensor system 10 of FIG. 1. is used to measure the intensity of light that is incident on sensor 12. Photodetecting sensor 12 could be a photodiode or any other device that produces electrical charge in response to incident light. The rate of charge production (i.e. the photo-current produced by the photodetector) is proportional to the intensity of the incident light that strikes the sensor.

The system of FIG. 1 operates as follows: To commence the charge integration process, reset switch 14 closes momentarily to reset the sensor to a known state (e.g. zero accumulated charge or to a reference level such as the positive power supply). Reset switch 14 then opens to allow sensor 12 to begin integrating (i.e. collecting charge). After an integration time T, sampling switch 16 closes, thereby allowing the accumulated charge to pass onto charge collecting capacitor 18 and produce a corresponding analog voltage V(T) at the input terminal of analog processing circuit 20. This voltage V(T) is proportional to the amount of charge that accumulated in sensor 12 over the integration time T. Analog processing circuit 20 then amplifies, buffers, or otherwise processes this analog voltage to produce a corresponding analog signal S(T) at the input of ADC 22. ADC 22 then converts this analog signal to a digital representation (typically a binary number) at its output.

Although this approach works reasonably well, the range of light intensities that can be measured is limited by the relatively small dynamic range of the system 10. The relationship between the light intensity and the charge collected Q(T) can be described by $Q(T)=IT$, where I is the photocurrent from sensor 12. I is proportional to the intensity of the incident light. As explained above, this charge Q(T) is dumped onto capacitor 18 at the end of the integration cycle to produce a voltage V(T) according to the equation $V(T)=Q(T)/C$, and this voltage V(T) is then converted by analog processing circuit 20 to a corresponding signal S(T).

Dynamic range is specified as the ratio of the maximum signal swing that analog processing circuit 20 can produce to the minimum signal level from analog processing circuit 20 that can be meaningfully detected. Thus, to quantify the dynamic range of sensor system 10, let $Q_{max}$ denote the maximum charge capacity of sensor 12 and let $S_s$ denote the maximum signal swing from analog processing circuit 20 (because $S_s$ is determined either by the sensor's charge collecting capacity $Q_{max}$ or by saturating voltage swings in analog processing circuitry 20, $S_s$ does not necessarily correspond to $Q_{max}$). Let $Q_n$ denote the minimum charge noise signal from sensor 12, and let $S_n$ be the minimum noise signal from analog processing circuit 20. $S_n$ is due to the sum of dark signal noise, thermal noise, and other noise sources such as shot noise in the MOSFET transistors of analog processing circuit 20. Finally, let $S_{min}$ (corresponding to a charge $Q_{min}$) denote the minimum signal which can be meaningfully detected. $S_{min}=\alpha S_n$ where $\alpha$ is typically a small number (i.e. 1–4). Thus, the dynamic range of system 10 is specified by $S_s/S_{min}$.

For a given integration time T, since the maximum non-saturating photo-current that can be detected is an $I_{max}$ corresponding to $S_s$ and the minimum photo-current that can be detected is an $I_{min}$ corresponding to $S_{min}$, the dynamic range of the system can also be specified by $I_{max}/I_{min}=S_s/S_{min}$. If the light intensity is too high, the sensor system saturates at $S_s$. The sensor system cannot differentiate any incident light that has a higher intensity than that of the critical light intensity that exactly produces $I_{max}$ and $S_s$. Conversely, if the light intensity is too low, the sensor's signal is dominated by noise and is effectively lost in $S_n$ (i.e. $S(T) \leq S_{min}$). Although varying the integration time varies both $I_{max}$ and $I_{min}$ (since $Q(T)=\int I\, dt$), the dynamic range remains unchanged. In other words, although varying the integration time T will vary the absolute maximum and minimum light intensities that can be measured, the relative light intensity resolution of the system remains unchanged at $S_s/S_{min}$.

This limited dynamic range can seriously hamper the performance of a sensor system. For example, consider a two-dimensional array of photo-sensors (i.e. pixels) used to capture an image for a digital camera. The luminance of typical natural and man-made scenes often span 5 orders of magnitude. However, the dynamic range of typical light sensors, such as photodiodes, is much smaller. Consequently, when a scene contains a wide range of light intensities such as bright sunlight and dark shade, the resulting image obtained by the photo-sensor array loses many pictorial details. If the integration time T is minimized such that the brightest portions of the scene do not saturate their corresponding photo-sensors, many pictorial details of the darker areas will be lost. These details will be lost because the small signals produced by the photo-sensors corresponding to the darker areas of the scene will not be sufficient to overcome the noise signal $S_n$ in those photo-sensors. Conversely, if the integration time T is maximized such that details of the darkest portions of the scene are discernible by their corresponding photo-sensors, the brighter areas of the scene will saturate their corresponding photo-sensors, and the pictorial details of the brighter portions of the scene will be lost. In this manner, normal electronic image acquisition is often characterized by images with saturated or cut-off pixels, or both.

The general problem can be better understood with reference to FIG. 2. which illustrates how an ideal, noiseless, monotonic analog signal S'(t) from an integrating sensor is corrupted and limited by a generic sensor system 30. In FIG. 2, generic sensor system 30 is represented by a summing circuit 32, a signal limiter 34, and a signal acquisition circuit (e.g. ADC) 36. Summing circuit 32 and signal limiter 34 are not meant to represent physical blocks in a real sensor system, but instead they are shown to represent how various non-ideal elements within a generic sensor system effectively limit the resolvable dynamic range of the ideal analog signal S'(t). In FIG. 2, the ideal analog signal is first corrupted by a noise signal $S_n$ which additively combines with the signal S'(t) at the summing circuit 32. This additive noise signal limits the smallest resolvable signal S(t) to $S_{min}$ since the noise-corrupted signal must be larger than the added noise $S_n$ to retain meaningful accuracy ($S_{min}$ must be α times larger than $S_n$, according to our earlier definition). The noise-corrupted analog signal then passes through signal limiter 34 which limits the maximum level of S(t) to $S_s$ if the analog signal is monotonically increasing or to $-S_s$ if the analog signal is monotonically decreasing. In other words, signal limiter 34 limits the magnitude of the analog signal to $S_s$. In this manner, generic sensor system 30 limits the dynamic range of the final sensor signal S(t) to $S_s/S_{min}$. However, we want to be able to resolve an analog signal S'(t) whose value at time T would be larger than $S_s$ if the signal limiter 34 were not present in system 30 while still being able to resolve an analog signal S'(t) as small as $S_{min}$. Prior art techniques do not provide an effective solution for this problem.

Psycho-visual theory (Weber's Law) tells us that human vision is less sensitive to intensity variations in a strong light stimulus than in a weak light stimulus. In other words, as the overall light intensity of a scene increases, the human eye becomes less sensitive to small variations in light intensity. For example, using arbitrary units, in a scene with 100 luminosity units, the eye may be able to discern intensity variations as small as 1 unit. However, in another scene with 1000 luminosity units, the eye will only be able to discern intensity variations of 10 units. Thus, although the human eye has a huge overall dynamic range of about 12 orders of magnitude (humans can see in almost absolute darkness in one extreme to directly into bright, on-coming headlights in the other), the human eye's resolution within any particular lighting condition is much smaller.

Weber's Law corresponds well to floating-point representation. To illustrate this correspondence, consider a commonly used form of decimal floating-point representation known as scientific notation. Scientific notation represents any number by several digits that comprise a mantissa and several other digits that comprise to an exponent. The mantissa holds all the significant digits of the number being represented, whereas the exponent indicates the magnitude of the number being represented. For example, using scientific notation, the number 10,600 would be represented by $1.06 \times 10^4$. The 3-digit mantissa 1.06 indicates that the number is only significant (accurate) to 3 digits including the leftmost digit. The exponent 4 indicates the order of magnitude of the number, and in this case, it indicates that the mantissa should be multiplied by $10^4$ to recover the entire number. This use of scientific notation indicates that the number is accurate only to +/−50 units since the mantissa holds only 3 digits, the lowest of which is the 100's position. In a similar manner, the number 106,000 would be expressed in scientific notation as $1.06 \times 10^5$. As before, the same 3-digit mantissa 1.06 indicates that the number is only significant (accurate) to 3 digits including the leftmost digit. However, although the mantissa is exactly the same as before, since the exponent has changed from 4 to 5, this indicates that the second number is one order of magnitude greater than the first number. This also indicates that the second number is significant only to +/−500 units. This is because although the mantissa continues to hold 3 digits, the least significant one is now in the 1000's position. Weber's Law is similar in that the human eye's relative resolution within any particular lighting condition is constant (i.e. the same number of mantissa digits) despite the fact that the eye can see over a huge range of lighting conditions (i.e. orders of magnitude in overall light intensity of a scene).

To attempt to mimic Weber's Law, many imaging systems favor non-linear quantizing to efficiently encode the visual information of the scene. Often, a high-resolution ADC followed by digital conversion logic is used to perform non-linear quantizing, but this is an expensive approach that requires an expensive ADC and throws away most of its resolution. For example, a 10-bit ADC may be needed to produce a 6-bit non-linear code. Additionally, non-linear quantizing does not increase a sensor system's fundamental dynamic range.

There are numerous prior art attempts at increasing a sensor system's effective dynamic range. Most of these approaches can be divided into three categories: integration time control, gain control, and compression of the response curve. Some of these approaches will now be discussed as applied to a sensor system comprising a 2-dimensional array of photo-sensors for acquiring an image on a focal plane:

1. Shuttering. This approach uses externally controlled, variable integration times to attempt to increase the dynamic range of a sensor system. The variable integration time can be implemented electronically or manually, but in any case, this method fails when a scene includes a wide range of intensities. For example, if the shuttering control system shortens the integration time to avoid saturating the pixels, the dim part of the image is buried under the noise. If the shuttering mechanism lengthens the integration time to avoid cutting-off the weaker pixels, some pixels will saturate thereby causing the brighter portions of the image to be lost. Although this method expands the overall dynamic range of the sensor system, the dynamic range at any particular setting remains unchanged at $S_s/S_{min}$.

2. Local Shuttering. This approach determines integration times for small, local sub-regions within a sensor array. Typically, a plurality of integration control circuits are located within the focal plane of the sensor array and each of them controls the integration time of a block of pixels. The method requires substantial area overhead and computation to piece together the final image. Although all the pixels in a local sub-region have the same integration time, this method does widen dynamic range of the overall sensor system. Assuming the minimum integration time is T and the maximum integration time is kT, where k>1, then the minimum detectable intensity is proportional to $S_{min}/kT$ and the maximum non-saturating, detectable intensity is proportional to $S_s/T$. Thus, the overall dynamic range is $kS_s/S_{min}$, a factor of k greater than the original dynamic range. However, individual pixels within a local sub-region can still saturate or be cut-off.

3. Individual Pixel Reset. This scheme uses separate external exposure control for each individual pixel. Like local shuttering, this method requires feedback, but it requires an even greater amount of memory and processing to set the integration time for each pixel. Like local shuttering, this method also increases dynamic range by a factor of k.

4. Local Gain Control. One prior art attempt at increasing a sensor's effective dynamic range by gain control is described in U.S. Pat. No. 5,614,948 by Hannah. This approach determines an optimized gain for each analog processing circuit corresponding to a small, local sub-region comprising several pixels within a sensor array. This method also requires feedback, substantial memory, and a substantial amount of processing to set the gain of each sub-region. Again, like local shuttering and individual pixel reset, this method also increases dynamic range by a factor of k.

5. Floating-point ADCs. This method attempts to increase the overall dynamic range of a sensor system by directly performing floating-point analog-to-digital conversion of the analog signal. This technique can be understood with reference to FIG. 3 which shows a simplified block diagram of a prior art floating-point ADC system 50. Floating-point ADC system 50 comprises a programmable gain amplifier (PGA) 52, a fixed-point ADC 54, and a range selection circuit 56. Range selection circuit 56 provides an M-bit digital feedback signal that simultaneously serves as the exponent for the floating-point conversion and as the signal that sets the gain of PGA 52. PGA 52 receives an analog input signal V(t) and amplifies it with a gain corresponding to the digital code from range selecting circuit 52 to produce analog signal S(t). Fixed-point ADC 54 receives this amplified analog signal S(t) from PGA 52 and converts it to an N-bit digital representation that serves as the mantissa for the floating-point conversion. For each analog-to-digital conversion, range selecting circuit 56 must step through several digital codes (exponent values) until it sets the gain of PGA 52 such that the N-bit code from fixed-point ADC 54 lies somewhere between the minimum and maximum digital codes of fixed-point ADC 54. Because of the need for PGA 52 and range selecting circuit 56, this techniques requires extra circuit area. This technique also requires a relatively long conversion time to perform the iterative conversion process. Although this method increases the dynamic range of the digital output from the ADC relative to that of an N-bit fixed-point ADC, because the PGA equally amplifies both signal and noise, this method does not increase the fundamental dynamic range of the sensor system. The system's dynamic range is still limited to $S_s/S_{min}$.

6. Temporary Capacity Saturation. This method attempts to increase the dynamic range of a sensor system by compressing its response curve in a non-linear fashion as follows: From time t=0 to time $t=T_d$, the system is altered such that the sensor can integrate charge only up to a faction, $\beta$, of its normal capacity (0<$\beta$<1). Any excess charge beyond $\beta Q_{max}$ that is produced between t=0 and $t=T_d$ is drained off. At $t=T_d$, the sensor's capacity is restored to its full value, and the system then continues to integrate until a later time t=T. FIG. 4 pictorially illustrates this technique. FIG. 4 plots collected charge versus time for two curves corresponding to different lighting intensities. Curve A corresponds to a strong lighting condition while Curve B corresponds to a weak lighting condition. Note that until time $T_d$, whenever the integrating photo-current I exceeds $\beta Q_{max}/T_d$, the collected charge is clipped at $\beta Q_{max}$. The collected charge as a function of input photo-current I is plotted in FIG. 5 and can be expressed as:

$$Q(T) = \begin{cases} IT & \text{if } 0 \le I \le \beta Q_{max}/T_d \\ \beta Q_{max} + I(T-T_d) & \text{if } \beta Q_{max}/T_d \le I \le Q_{max}(1-\beta)/(T-T_d) \\ Q_{max} & \text{if } I > Q_{max}(1-\beta)/(T-T_d). \end{cases}$$

Assuming $Q_{max}$ corresponds to $S_s$, to compute the dynamic range of this method, let $I_{min}=Q_{min}/T$ and $I_{max}=Q_{max}(1-\beta)/(T-T_d)$. The dynamic range is therefore $I_{max}/I_{min}=[Q_{max}/Q_{min}](1-\beta)/(1-T_d/T)$. Thus, the dynamic range is increased by a factor of $(1-\beta)/(1T_d/T)$. For example, if $\beta=¼$ and $T_d=3T/4$, the dynamic range is increased by a factor of 3. This technique is a very crude approximation to a general logarithmic compression modeled by the following equation:

$$Q((T)=[Q_{max}/k)]\log(1+I/I_o)$$

where Q is the collected charge and I is the input photo-current. From this equation, we have $I_{min}=I_o[e^{(kQmin/Qmax)}-1]$ and $I_{max}=I_o[e^k-1]$ giving:

Dynamic Range=$[e^k-1]/[e^{(kQmin/Qmax)}-1]\approx[(e^k-1)/k](Q_{max}/Q_{min})$ if $Q_{max}/Q_{min}>>1$ Thus, this general method of logarithmic widening of the dynamic range results in a gain of $(e^k-1)/k$. Although this is a respectable increase in dynamic range, implementing this method can be very complicated and the pixels tend to be non-uniform.

Clearly, all these prior art attempts at increasing the dynamic range of an integrating sensor system suffer from either inadequate performance or complicated and expensive implementation (i.e. circuitry), or both.

One other prior art technique that attempts to extend the dynamic range of a sensor system in a very different manner from those discussed above was presented at the 1997 IEEE Workshop on Charge-Coupled Devices and Advanced Image Sensors. In the paper entitled "Recent Progress of CMD Imaging" by Tsutomu Nakamura and Kuniaki Saitoh, a technique is described wherein an image sensor array is scanned twice. The first scanning outputs signals with a short exposure time, and the second scanning outputs signals with a long exposure time. The two signals are then synthesized to form an image with greater dynamic range than that which is possible with only one scanning. Although this prior art technique can improve the dynamic range of the system by scanning twice and outputting signals after two different integration times, it does not provide a means for converting the signal to digital form. Complex external circuitry is needed to combine the signals and perform analog-to-digital conversion. It is not a technique for performing analog-to-digital conversion.

Objects and Advantages

It is therefore an object of the present invention to provide a method and apparatus for extending the dynamic range of an integrating sensor system that overcomes the limitations of the prior art. In particular, it is an object of the present invention to provide a method and apparatus that effectively extends the dynamic range of an integrating sensor system while requiring relatively simple circuitry and small circuit area.

It is also an object of the present invention to provide a method and apparatus that effectively extends the dynamic range of an integrating sensor system and provides a binary, floating-point representation of the sensor system's analog signal.

It is a still further object of the present invention to provide a method and apparatus that effectively extends the dynamic range of an integrating sensor system while producing a bit-serial output that conforms to pixel level analog-to-digital conversion as described in U.S. Pat. No. 5,461,425 by Fowler et. al.

SUMMARY OF THE INVENTION

Accordingly, using an analog-to-digital converter with a maximum input signal of $S_s$, the present invention provides a method and apparatus for converting a monotonically changing analog signal to a cumulative floating-point, digital representation even if the analog signal has a value greater than $S_s$ at time t=T. The method comprises the following steps: First, the analog signal is reset to a reference value at an initial time t=0. Then, the analog signal is sub-converted at a first time $T_1>0$ to obtain an first digital representation which corresponds to the magnitude of the analog signal at this first time. Next, the analog signal is sub-converted at a subsequent time $T_2>T_1$ to obtain a second digital representation which corresponds to the magnitude of the analog signal at this second time. The two digital representations are then combined into an intermediate floating-point, digital representation with greater dynamic range than either of the first two digital representations on their own. The above steps of sub-converting the analog signal and combining each new digital representation with the existing intermediate digital representation to obtain a new intermediate representation are repeated for other subsequent times $T_3>T_2$, $T_4>T_3$, . . . $T_M>T_{M-1}$ in order to produce a cumulative floating-point, digital representation of the analog signal at time t=T.

An embodiment of an apparatus for converting a monotonically changing analog signal to a cumulative floating-point, digital representation with a wide dynamic range according to the present invention comprises the following: a) a means for resetting the analog signal to a reference value at an initial time t=0; b) a first signal generator for generating a first signal having a plurality of levels; c) a comparator having a first input connected to receive the first signal and a second input connected to receive the analog signal; d) a binary signal generator for generating a series of binary signals; and e) a latch having a first input coupled to receive the output signal from the comparator. The latch also has a data input that receives the binary signal. The output signal from the comparator controls when the latch provides an output signal that corresponding to the binary signals.

The circuit provides a first N-bit digital code representing the analog signal at a first sub-conversion time $T_1>0$. The circuit also provides at least a portion of subsequent N-bit digital codes representing the analog signal at subsequent sub-conversion times $T_2>T_1$, $T_3>T_2$, . . . $T_M>T_{M-1}$. A combination of the first N-bit digital code and the portions of the subsequent N-bit digital codes produces a wide dynamic range, floating-point, digital representation of the analog signal at time t=T.

BRIEF DESCRIPTION OF THE DRAWINGS

The present invention will be described with reference to the following drawings wherein like numerals refer to like components.

DETAILED DESCRIPTION OF THE PREFERRED EMBODIMENT

The present invention provides for a method and apparatus for converting an analog signal with a small dynamic range to a large dynamic range, floating-point, digital representation. Although the method and apparatus are suitable for any general integrating sensor system, they are particularly suitable for use in integrating sensor systems comprising a two-dimensional focal plane array of photo-sensors used to capture an image.

To fundamentally describe the method of the present invention, consider a basic light sensing cell (used for one pixel in an image sensor array) which produces an analog signal S(t) at a sensing node in response to an incident light of intensity I. At a time t=T, the analog signal can be approximated by the linear function:

$$S(T) = \begin{cases} RQ_{min} & \text{if } IT < Q_{min} \\ RIT & \text{if } Q_{min} \leq IT \leq Q_{max} \\ RQ_{max} & \text{if } IT > Q_{max} \end{cases}$$

where T is the integration or conversion time and R is the responsivity of the light sensing cell. Therefore, the resulting analog signal has a dynamic range limited to $Q_{max}/Q_{min} = S_s/S_{min}$. If we were to integrate for a fixed amount of time T and then perform an analog-to-digital conversion, the resulting digital representation would not only have a resolution determined by the resolution of the particular analog-to-digital converter that was used, but it would also have at best the same limited dynamic range as that of this analog signal S(T).

The method of the present invention differs from prior art techniques in that instead of integrating for a fixed amount of time and then dumping out the analog signal at time t=T for a single analog-to-digital conversion, the analog output signal of the sensing cell is sub-converted at a plurality of times, such as at $T_1>0$, $T_2=10T_1$, $T_3=10T_2=100T_1$, ... $T_M=10T_{M-1}=10^{M-1}T_1$. A fixed-point analog-to-digital converter produces a numerical representation of the analog signal at each sub-conversion time, and the results of all the sub-conversions are combined into a cumulative, floating-point, digital representation. The method effectively widens the dynamic range of the sensing system. It allows for the quantization of very strong inputs by sub-converting the signal after a very short integration time $T_1$ before these inputs saturate the sensor. However, it also allows for the quantization of very weak inputs by sub-converting these signals after a long integration time $T_M \leq T$. In other words, not only does the method allow for the measurement of strong signals before they saturate the sensor system, but it also collects (i.e. integrates) more signal (e.g. charge) in order to more effectively measure weak signals.

Figure 6:
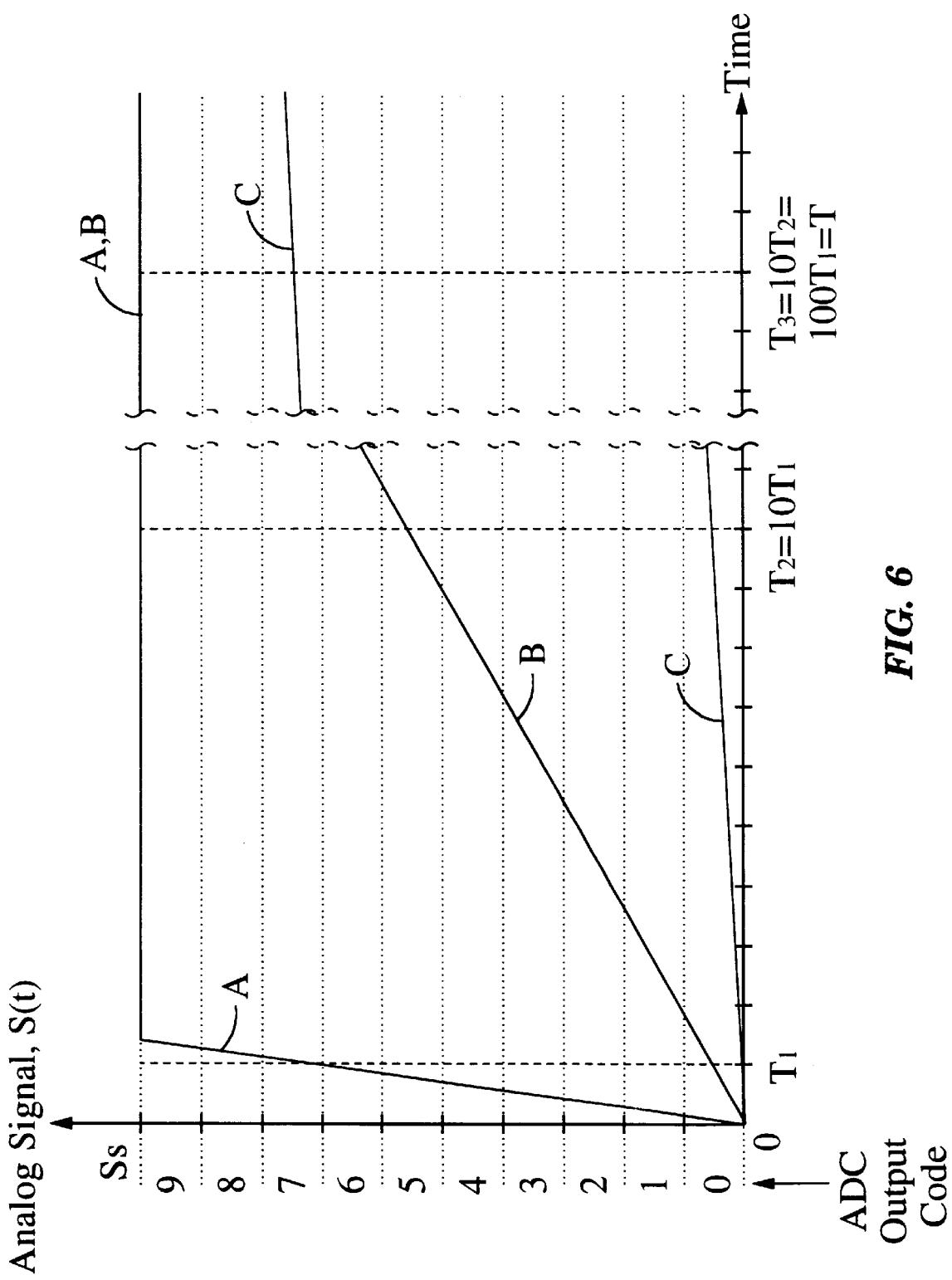
FIG. 6 illustrates an application of the method of the present invention to a sensor system that uses a single fixed-point ADC with only one decimal bit of resolution wherein the method enables the sensor system to convert three analog signals whose intensities span 3 orders of magnitude to corresponding floating-point, digital representations with one decimal bit of mantissa accuracy.

An example of how this method extends the dynamic range of a sensor system is described here with reference to FIG. 6. The figure illustrates how the method of the present invention can be used to convert three analog signals whose intensities span 3 orders of magnitude to corresponding floating-point digital representations with one decimal bit of mantissa accuracy while using a single fixed-point ADC with only one decimal bit of resolution. FIG. 6 plots the analog signal from a hypothetical sensor system versus time for three hypothetical analog signals corresponding to three possible lighting conditions. Signal A is a very strong sensor signal (e.g. strong light), Signal B is a moderate sensor signal (e.g. moderate light), and Signal C is a very weak sensor signal (e.g. dim light). Assume the sensor system is reset to zero and begins integrating at time t=0. Also assume that the sensor's maximum analog signal level is $S_s$, and that the sensor's analog signal is converted by an ADC which quantizes the signal to one of 10 levels represented by the decimal digits 0 through 9, as indicated along the left side of FIG. 6.

In this example, the method calls for sub-converting the sensor's analog signal at three sub-conversion times: $T_1$, $T_2=10T_1$, and $T_3=T=100T_1$. From FIG. 6, we see that the ADC will produce a 7, a 9 and a 9 at three sub-conversion times $T_1$, $T_2$, and $T_3$, respectively, for Signal A. If these ADC outputs are appended to one another, we see that Signal A is represented by 799. Likewise, the ADC will produce a 0, a 5 and a 9 at three sub-conversion times T1, T2, and T3, respectively, for Signal B; and it will produce a 0, a 0 and a 7 at three sub-conversion times T1, T2, and T3, respectively, for Signal C. Appending these ADC outputs to one another, Signal B is represented by 059 and Signal C by 007. Ignoring the leading zeroes, as well as all 9's following the leftmost non-zero digit, we see that the method represents Signal A by $7 \times 10^2$, Signal B by $5 \times 10^1$, and Signal C by $7 \times 10^0$. This is precisely decimal floating-point representation with single digit mantissa resolution. In this manner, we have effectively extended the dynamic of the sensor system range by two orders of magnitude while continuing to use a simple 10-level ADC. The prior art technique of performing only one conversion (i.e. no sub-conversions) could never resolve all three signals at once—at least one signal would either saturate the ADC or fall below its smallest quatization step (i.e. disappear into the quatization noise of the ADC).

Using the method of the present invention, the digital outputs from the ADC have a constant relative accuracy because each input signal, according to its magnitude, has its own sub-conversion time during which the analog signal from the sensing cell is neither saturated nor so small that it is either covered by the noise or smaller than the minimum resolution of the ADC. The method relies on the fact that the analog signal is a monotonic ramp signal, and this method can be used in any application which produces a monotonically changing analog signal in response to an applied stimulus. Neither a PGA nor feedback are needed because sub-converting a ramp signal is functionally analogous to using a PGA and feedback.

Having described the basic principles of the method of the present invention, an embodiment of the technique can now be presented. This embodiment of the present invention can be termed a wide dynamic range, floating-point, bit serial analog-to-digital converter (FPBS ADC). This ADC produces N-bits of mantissa resolution and variable exponent range, thereby allowing the use of a sensor system with a limited analog signal range to produce a digital representation with a much larger dynamic range. This embodiment of the method of the present invention effectively increases the dynamic range of the entire sensor system while continuing to use a sensor with a limited analog dynamic range.

Figure 7:
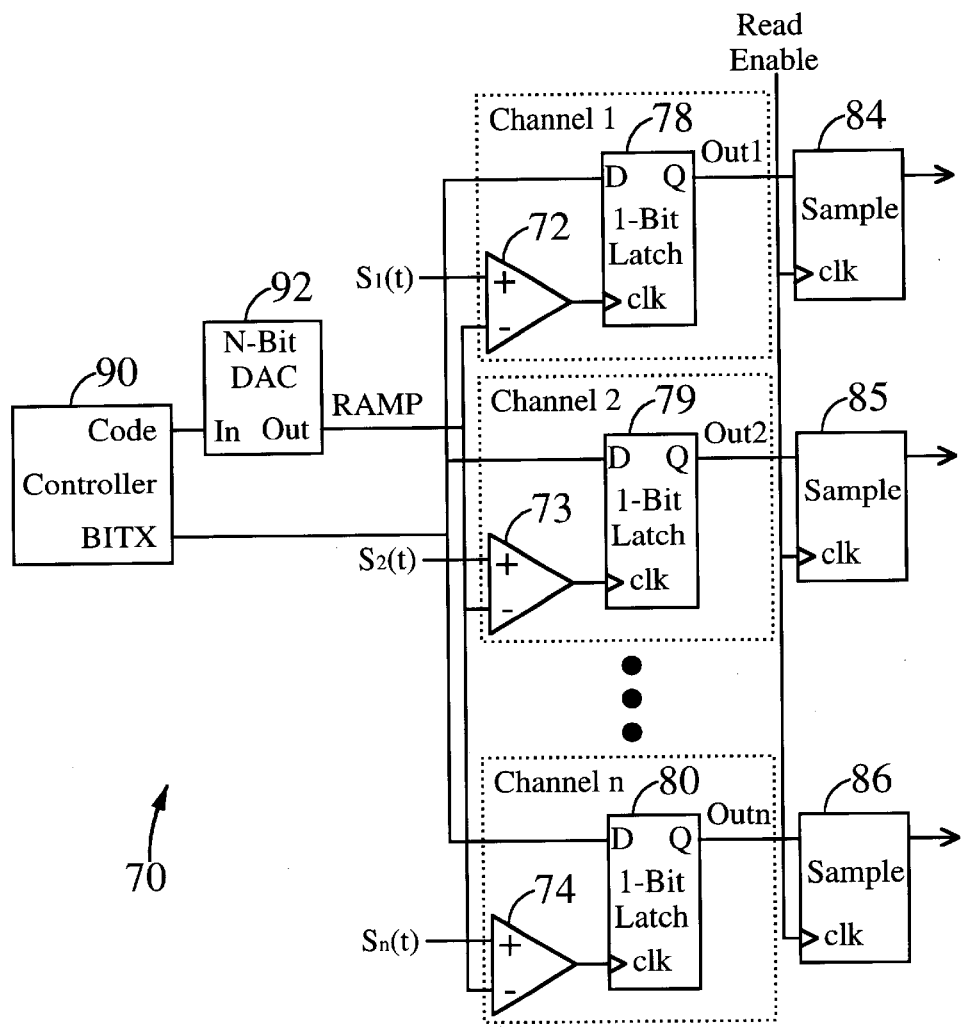
FIG. 7 illustrates an n-channel bit-serial analog-to-digital converter incorporating global circuitry and circuitry associated with each channel for use in an embodiment of a floating-point, bit-serial analog-to-digital conversion scheme according to the present invention.

A block diagram of an n-channel, N-bit, bit-serial analog-to-digital converter (N-bit BS ADC) 70 is shown in FIG. 7. Each channel is used to perform analog-to-digital conversion on the analog signal of one sensor. Thus, BS ADC 70 of FIG. 7 can be used to perform analog-to-digital conversion of n signals from n sensors simultaneously. Each channel of the BS ADC of FIG. 7 comprises a 1-bit comparator 72, 73 or 74, a 1-bit latch 78, 79, or 80, and a 1-bit sampling circuit 84, 85 or 86. Additionally, BS ADC 70 of FIG. 7 includes a controller 90 and an N-bit DAC 92 that is shared among all n channels. Controller 90 may be a state machine, a programmed microprocessor, or any other circuit for generating a series of binary codes. The analog input of each of the 1-bit comparators 72–74 of a corresponding channel receives the analog signal $S_r(t)$ from the sensor that corresponds to that channel.

Before describing how BS ADC 70 of FIG. 7 can be used to perform floating-point analog-to-digital conversion according to the method of the present invention, it is important to understand how the circuit performs fixed-point, N-bit analog-to-digital conversion.

To simplify notation, we assume that the range of the analog signal values (e.g. from the photodiode sensors) into the inputs of 1-bit comparators 72–74 is the unit interval (0,1]. Thus, to quantize an analog signal to N-bits of precision, the unit interval is partitioned into $2^N$ subintervals $(i/2^N,(i+1)/2^N]$, $0 \leq i \leq (2^N-1)$, and each subinterval is represented by a unique N-bit codeword. An N=3 example is given in Table 1.

TABLE 1

Input/Output Values of a 3-bit ADC

| Subinterval Index (i) | Analog Input Signal Range | Standard Binary Code | Gray Code |
|---|---|---|---|
| 1 | 0 to 1/8 | 000 | 000 |
| 2 | 1/8 to 2/8 | 001 | 001 |
| 3 | 2/8 to 3/8 | 010 | 011 |
| 4 | 3/8 to 4/8 | 011 | 010 |
| 5 | 4/8 to 5/8 | 100 | 110 |
| 6 | 5/8 to 6/8 | 101 | 111 |
| 7 | 6/8 to 7/8 | 110 | 101 |
| 8 | 7/8 to 8/8 | 111 | 100 |

In this example we use a Gray code to represent the quantized analog signal because of its robustness against single errors that may occur in the operation of the ADC. To find the N-bit digital codewords for each analog input signal, the BS ADC performs a sequence of N binary questions of the form: "Is analog input signal S within a subinterval range A (i.e. S∈A?)," where A is a subset of the set of subintervals. This question is asked for all eight of the subintervals in Table 1. The answer to each question corresponds to one bit of precision. Each question is broadcast to all n channels of the BS ADC simultaneously, and thus all n digital signal values corresponding to the n analog signals are generated simultaneously, one bit at a time.

The order in which the sequence of questions are asked is arbitrary. Thus, for example, the questions may be asked such that the most significant bit (MSB) is produced first, followed by the second MSB and so on, or may be asked in the reverse order to produce the least significant bit (LSB) first, followed by the second LSB, etc. The set of questions can easily be determined from any given binary code as follows. The codewords (i.e. gray code) are listed in the order of increasing subinterval index i as in Table 1. Thus, the first codeword corresponds to i=1, the second to i=2, and the last to $i=2^N$. For each bit position of the N-bit digital output of the ADC, the set A of subintervals to be compared to the analog signal S is the union of subintervals whose codewords have a "1" in that position. For example, in a 3-bit Gray code as in Table 1, the list of questions are: 1) is S in the range of ½ to 1 (S∈(½, 1]) for the leftmost bit (bit 2); 2) is S in the range of ¼ to ¾ (S∈(¼,¾]) for the middle bit (bit 1); and 3) is S in either the range of ⅛ to ⅜ or ⅝ to ⅞ (S∈(⅛,⅜]∪(⅝,⅞]) for the rightmost bit (bit 0).

Figure 8:
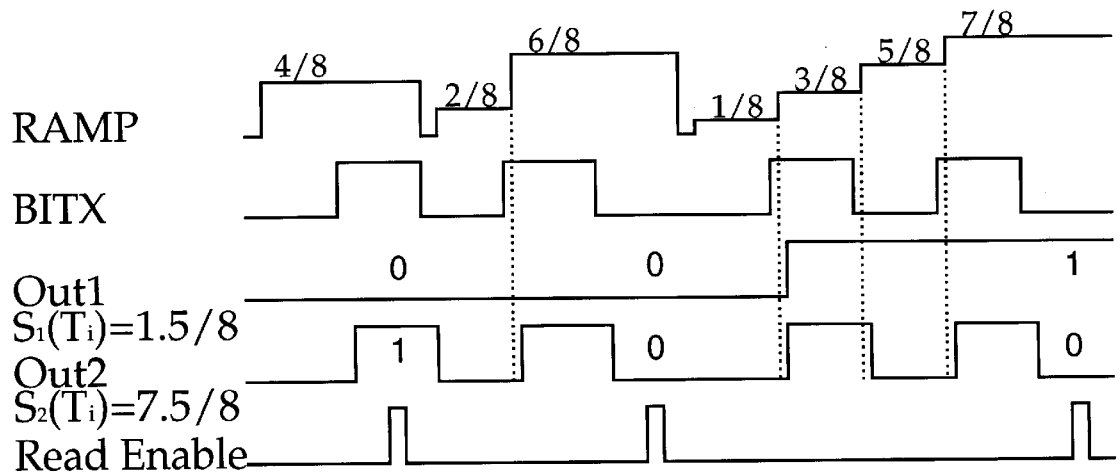
FIG. 8 illustrates several of the signals that are present in the circuit of FIG. 7 during a cycle of N-bit, fixed-point analog-to-digital conversion.

BS ADC 70 implements each binary question by performing a set of binary is comparisons between the RAMP signal which is broadcast by a signal generator such as N-bit DAC 92 to all 1-bit comparators 72–74 in BS ADC 70. The values of the RAMP signal are such that RAMP $\in \{1/2^N, 2/2^N, \ldots (2^N-1)/2^N\}$. A RAMP signal for N=3 is shown in FIG. 8. If S>RAMP, the output of the comparator is a "1", otherwise it is a "0".

The values of RAMP used in the comparisons are determined from a given code as follows: The set of codewords are again listed in the order in increasing subinterval index i as in Table 1. For each bit position k (i.e. for an N=3 code as in Table 1, k=0, 1,2), the codewords are scanned to determine the ordered set of indices i, denoted $B_k$, such that either codeword i has a "0" in that bit position and codeword (i−1) has a "1" in that bit position, or codeword i has a "1" in that bit position and codeword (i−1) has a "0" in that bit position. The set of RAMP values for bit position k is the ordered set of values $[i/2^N: i \in B_k]$. For the N=3 example illustrated in FIG. 7, the set of RAMP values are ½ for the leftmost bit position (bit 2), ¼ and ¾ for the center bit position (bit 1), and ⅛, ⅜, ⅝, and ⅞ for the rightmost bit position (bit 0). This ordering of RAMP values corresponds to the 1's in the three bit positions of the Gray code shown in Table 1.

From the construction of the $B_k$ sets it can be shown that the total number of comparisons needed to achieve N bits of precision must be at least $2^N-1$. For the Gray code, this lower bound is exactly achieved since each two consecutive codewords differ in exactly one bit position. Thus, in addition to its robustness against errors, the Gray code has the important advantage of minimizing the number of binary comparisons which are needed. Of course, any other code with the unit distance property would have the same advantages as the Gray code.

To explain how each set of comparisons creates a bit in the Gray code, refer to the waveforms for the case N=3 shown in FIG. 8. The set of binary comparisons is preferably performed in the order of increasing RAMP value. The signal BITX from controller 90 is a binary global clock signal connected to the D inputs of latches 78–80. The values of RAMP can change every half-cycle of BITX. Each comparator 72–74 output is connected to the G input of its respective latch 78–80. When the G input is high, the output of latch 78–80 follows the BITX signal. When the G input is low, the latch 78–80 remains in its previous state.

Consider the set of comparisons for the LSB (bit 0). The RAMP signal values starts at ⅛, steps to ⅜ at the next BITX transition, then to ⅝, and finally to ⅞. For any analog signal value, there can be at most one transition from "1" to "0" at the output of comparator 72–74. For example, for a hypothetical analog signal A with a value of 1.⅝, the transition from "1" to "0" occurs when RAMP steps from ⅛ to ⅜, while for another hypothetical analog signal B with a value of 7.⅝ no transition occurs as shown in FIG. 8. The output of latch 78–80 is the last value of BITX before the comparator output transitions to a "0." Thus, the latch output is a "1" for signal 1 at bit position 0 after the transition of the comparator from "1" to "0," since BITX was a "1," prior to the transition.

A sampling circuit 84–86 in FIG. 7 connected to the output of each latch 78–80 receives a read enable signal at the end of each bit period to sample the output of latch 78–80 and provide the output bits whose values are numerically identified in FIG. 8.

Having described how BS ADC 70 of FIG. 7 performs fixed-point analog-to-digital conversion, an embodiment of the method of the present invention that uses a BS ADC to perform wide dynamic range, floating-point, analog-to-digital conversion can now be described for N-bit mantissa resolution. The most important property of the N-bit BS ADC in performing floating-point conversion is that it can read out any bit of its N-bit output code independently. This property is efficiently exploited in generating wide dynamic range, floating-point digital output, as described in the following paragraphs. This embodiment of the method of the present invention can be termed a floating-point, bit-serial analog-to-digital converter (FPBS ADC).

After the sensor cell resets and starts integrating, we sub-convert the sensor system's analog signal S(t) sequentially at sub-conversion times $T_1, T_2, T_3, \ldots T_M \leq T$. Because this FPBS ADC embodiment uses a BS ADC with a binary output, the preferred sub-conversion times are at $T_1$, $T_2=2T_1$, $T_3=4T_1$, $\ldots T_M=(2^{M-1})T_1$. For this discussion, again assume that the analog signal is normalized to the unit interval (0,1] for the sub-conversion time $T_1$, i.e. $IT_1 \epsilon (0, Q_{max}]$ or $S(T_1) \epsilon (0,1]$. At the first subonversion time, after the system has been integrating for a time $T_1$, the FPBS ADC digitizes $S(T_1)$ into an N-bit binary word $x_1 x_2 x_3 \ldots X_N$. Note that if the BS ADC is not sufficiently fast, this first sub-conversion may require the use of a sample-and-hold circuit to preserve a non-changing value of $S(T_1)$ as this first subonversion is performed.

At the second sub-conversion, after the system has been integrating for a time $T_2=2T_1$, there are two possible cases: 1) if $S(T_1) \epsilon (0,\frac{1}{2}]$, then $S(T_2)$ is represented by $x_2 x_3 \ldots X_{N+1}$, or 2) if $S(T_1) \epsilon (\frac{1}{2},1]$, then the analog signal saturates (i.e $S(T_2)=S_s$), and it is represented by 100 . . . 00 (Gray code for the maximum value). We see that only the '$X_{N+1}$' bit is new information, and since the BS ADC can read out any bit independently, the FPBS ADC needs only to read out the rightmost bit (bit 0) at the second subonversion time. This rightmost bit can then be suffixed to the digital word that was produced at the first sub-conversion time, and the two sub-conversions combine to generate an N+1 bit binary word $x_1 x_2 x_3 \ldots x_N x_{N+1}$ for $S(T_1) \epsilon (0, \frac{1}{2}]$ and $x_1 x_2 x_3 \ldots x_N 0$ for $S(T_1) \epsilon (\frac{1}{2},1]$. Similarly, at the third sub-conversion time, after the system has been integrating for a time $T_3=4T_1$, the FPBS ADC reads out only the Nth (rightmost) bit '$X_{N+2}$' and suffixes this bit to the existing N-bit binary word. We now obtain an N+2 bit binary word $x_1 x_2 x_3 \ldots x_N x_{N+1} x_{N+2}$ for $S(T_1) \epsilon (0,\frac{1}{4}]$, $x_1 x_2 x_3 \ldots x_N x_{N+1} 0$ for $S(T_1) \epsilon (\frac{1}{4}, \frac{1}{2}]$, and $x_1 x_2 x_3 \ldots x_N 00$ for $S(T_1) \epsilon (\frac{1}{2},1]$. By sub-converting the sensor's analog signal at $T_2$ and $T_3$ we have effectively increased the dynamic range of the sensor system by a factor of 4 because the minimum detectable input is $S_{min}/T_3$ and the maximum detectable input is $S_s/T_1$, resulting in an overall dynamic range of $4S_s/S_{min}$.

Table 2 shows an example of wide dynamic range, floating-point binary analog-to-digital conversion according to the present invention using an FPBS ADC for the case of N=2 (i.e. 2-bit mantissa resolution). Note that the FPBS ADC achieves N+2 bits of resolution for $(0,\frac{1}{4}]$, N+1 bits of resolution for $(\frac{1}{4},\frac{1}{2}]$, and N bits of resolution for $(\frac{1}{2},1]$. This is exactly floating-point precision with N-bit (2-bit) mantissa. To summarize, the following steps are performed in using a FPBS ADC to implement the method of the present invention for converting an low dynamic range analog signal to a wide dynamic range, floating-point digital representation: 1) sub-converting the analog signal at time $T_1$ to generate a corresponding N-bit binary word; 2) sub-converting the analog signal at a subsequent time $T_2$ to generate the Nth (rightmost) bit corresponding to the analog signal at this second sub-conversion time; 3) suffixing this Nth bit to the existing N-bit word; and 4) repeating steps 2) and 3) for subsequent subonversion times $T_3, T_4, \ldots T_M \leq T$, where T is a full conversion cycle.

TABLE 2

An Example of Wide Dynamic Range FPBS ADC Conversion with a 2-bit Mantissa, Gray Code Output

| Integrating Sensor Analog Input at $T_1$ $V(T_1)$ | FPBS ADC N-bit Gray Code Output at $T_1$ $x_1 x_2$ | FPBS ADC N-bit Gray Code Output at $T_2$ $x_2 x_3$ | Combined FPBS ADC Gray Code Output at $T_2$ $x_1 x_2 x_3$ | FPBS ADC N-bit Gray Code Output at $T_3$ $x_2 x_3$ | Combined FPBS ADC Gray Code Output at $T_3$ $x_1 x_2 x_3 x_4$ | Equivalent Standard Binary Output at $T_3$ $b_1 b_2 b_3 b_4$ |
|---|---|---|---|---|---|---|
| 0 to 1/16 | 0 0 | 0 0 | 0 0 0 | 0 0 | 0 0 0 0 | 0 0 0 0 |
| 1/16 to 2/16 | 0 0 | 0 0 | 0 0 0 | 0 1 | 0 0 0 1 | 0 0 0 1 |
| 2/16 to 3/16 | 0 0 | 0 1 | 0 0 1 | 1 1 | 0 0 1 1 | 0 0 1 0 |
| 3/16 to 4/16 | 0 0 | 0 1 | 0 0 1 | 1 0 | 0 0 1 0 | 0 0 1 1 |
| 4/16 to 5/16 | 0 1 | 1 1 | 0 1 1 | 1 0 | 0 1 1 0 | 0 1 0 0 |
| 5/16 to 6/16 | 0 1 | 1 1 | 0 1 1 | 1 0 | 0 1 1 0 | 0 1 0 0 |
| 6/16 to 7/16 | 0 1 | 1 0 | 0 1 0 | 1 0 | 0 1 0 0 | 0 1 1 1 |
| 7/16 to 8/16 | 0 1 | 1 0 | 0 1 0 | 1 0 | 0 1 0 0 | 0 1 1 1 |
| 8/16 to 9/16 | 1 1 | 1 0 | 1 1 0 | 1 0 | 1 1 0 0 | 1 0 0 0 |
| 9/16 to 10/16 | 1 1 | 1 0 | 1 1 0 | 1 0 | 1 1 0 0 | 1 0 0 0 |
| 10/16 to 11/16 | 1 1 | 1 0 | 1 1 0 | 1 0 | 1 1 0 0 | 1 0 0 0 |
| 11/16 to 12/16 | 1 1 | 1 0 | 1 1 0 | 1 0 | 1 1 0 0 | 1 0 0 0 |
| 12/16 to 13/16 | 1 0 | 1 0 | 1 0 0 | 1 0 | 1 0 0 0 | 1 1 1 1 |
| 13/16 to 14/16 | 1 0 | 1 0 | 1 0 0 | 1 0 | 1 0 0 0 | 1 1 1 1 |
| 14/16 to 15/16 | 1 0 | 1 0 | 1 0 0 | 1 0 | 1 0 0 0 | 1 1 1 1 |
| 15/16 to 16/16 | 1 0 | 1 0 | 1 0 0 | 1 0 | 1 0 0 0 | 1 1 1 1 |

It can be shown that for a flexed comparator gain-bandwidth product, the conversion time of the first sub-conversion is proportional to $4^N$ and the conversion time of each subsequent sub-conversion is proportional to $4^{N-1}$. Assuming that each full floating-point analog-to-digital conversion has M sub-conversions, the total conversion cycle time is then $(M+3)4^{N-1}$. This is significantly less than $4^{N-1+M}$, which would be the case if an N+M bit linear ADC were used.

Figure 9:
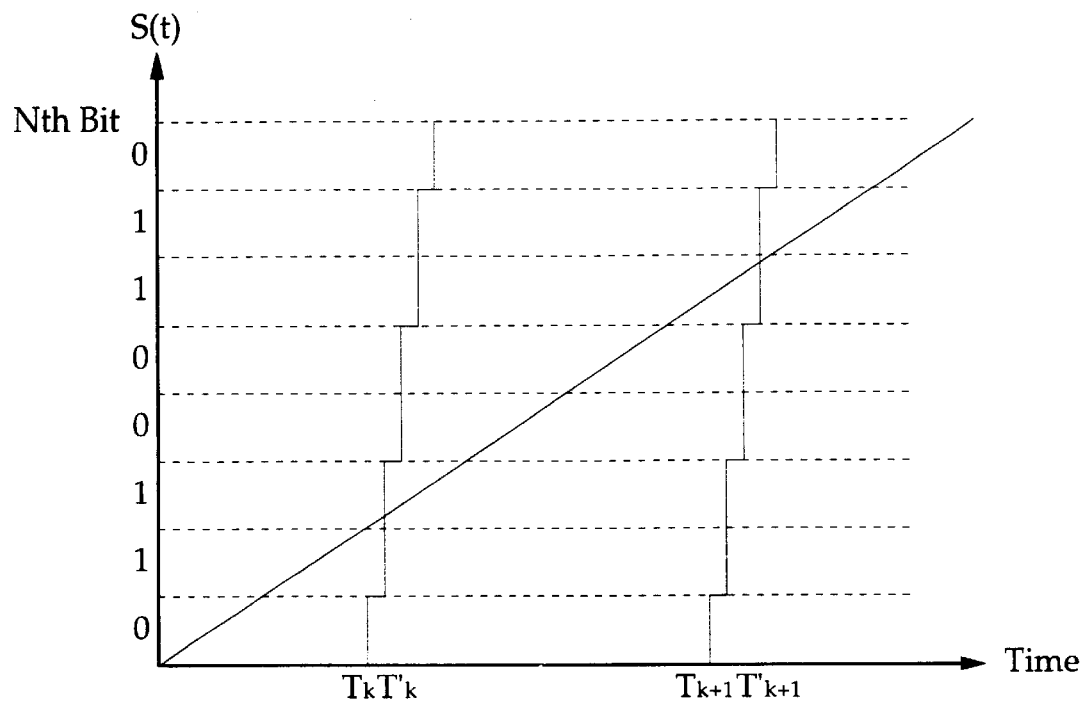
FIG. 9 illustrates the concept of aperture jitter as it relates to bit-serial analog-to-digital conversion in one embodiment of the present invention.

Since this embodiment of the method of the present invention does not normally employ sample-and-hold circuitry, the FPBS ADC should ideally sub-convert and read out a bit instantaneously, i.e. with no aperture jitter. Realistically, however, it takes a finite amount of time for the RAMP signal to step through all the comparisons levels ($2^{N-1}$ values). As illustrated in FIG. 9, the sub-conversions initiated at times $T_k$ and $T_{k+1}$ actually occur at times $T'_k$ and $T'_{k+1}$, resulting in an aperture jitters of $T'_k-T_k$ and $T'_{k+1}-T_{k+1}$, respectively. This appears be a problem for two reasons. First, analog signal values close to RAMP comparator thresholds might have metastability problems. Secondly, bits that make up the binary word have different aperture jitters. However, as long as the RAMP signal ramps up significantly faster than the analog is signal S(t), the finite conversion time introduces a uniform fixed DC offset, and hence does not introduce any inaccuracy. This is simply because the aperture jitter is exactly proportional to the signal S(t). Moreover, unit distance codes such as the Gray code used in the embodiment effectively guard against bit errors due to comparator metastability, as is well understood by those skilled in the art.

The FPBS ADC embodiment of the method of the present invention performs wide dynamic range, floating-point analog-to-digital conversion in a bit-serial fashion, and hence it is progressive and fully compatible with pixel level ADC data streams as described in U.S. Pat. No. 5,461,425 by Fowler et al. The FPBS ADC simply outputs bit-planes progressively, and it can stop whenever desired. Thus, the FPBS ADC allows a simple tradeoff between conversion cycle time and dynamic range: doubling the conversion cycle time gains 1-bit in dynamic range.

The FPBS ADC scheme described above assumed that the input light intensity I and responsivity R are constant during each floating-point analog-to-digital conversion cycle. We now discuss the validity of those assumptions and how the baseline scheme can be modified when these assumptions are not valid.

Figure 1:
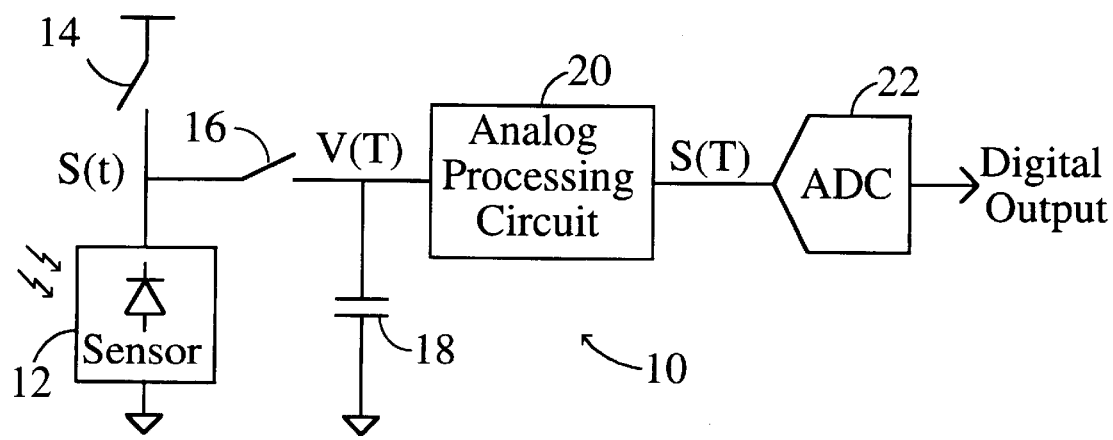
FIG. 1 is a simplified, typical integrating sensor system according to the prior art.
Figure 2:
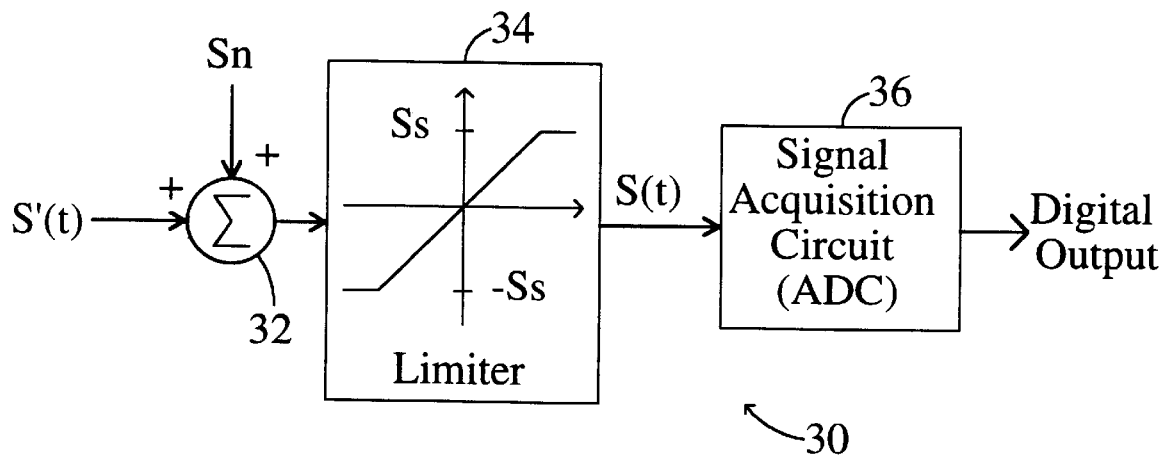
FIG. 2 is block diagram of a generic, prior art sensor system illustrating how the system corrupts and limits the effective dynamic range of an ideal, monotonic analog sensor signal.
Figure 3:
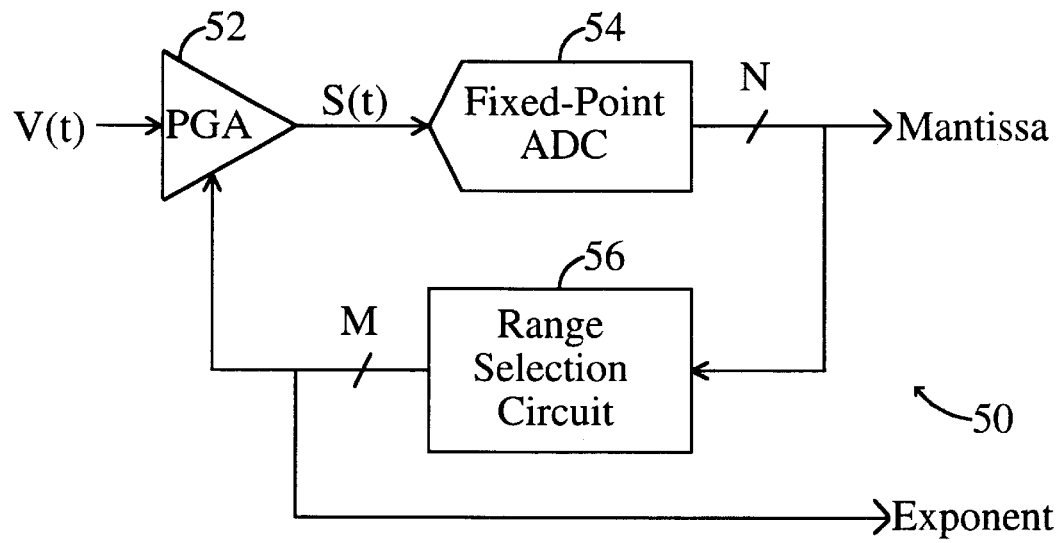
FIG. 3 is a simplified block diagram of a floating-point ADC system according to the prior art.
Figure 4:
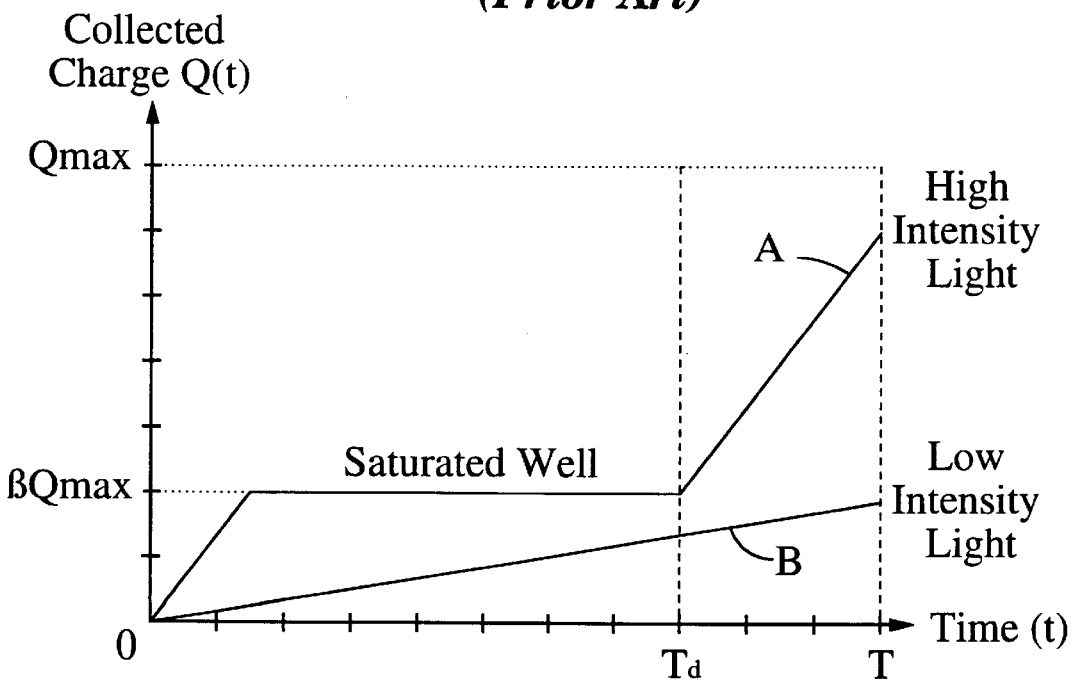
FIG. 4 is a plot of charge accumulation versus time for a sensor system using Temporary Capacity Saturation according to the prior art.
Figure 5:
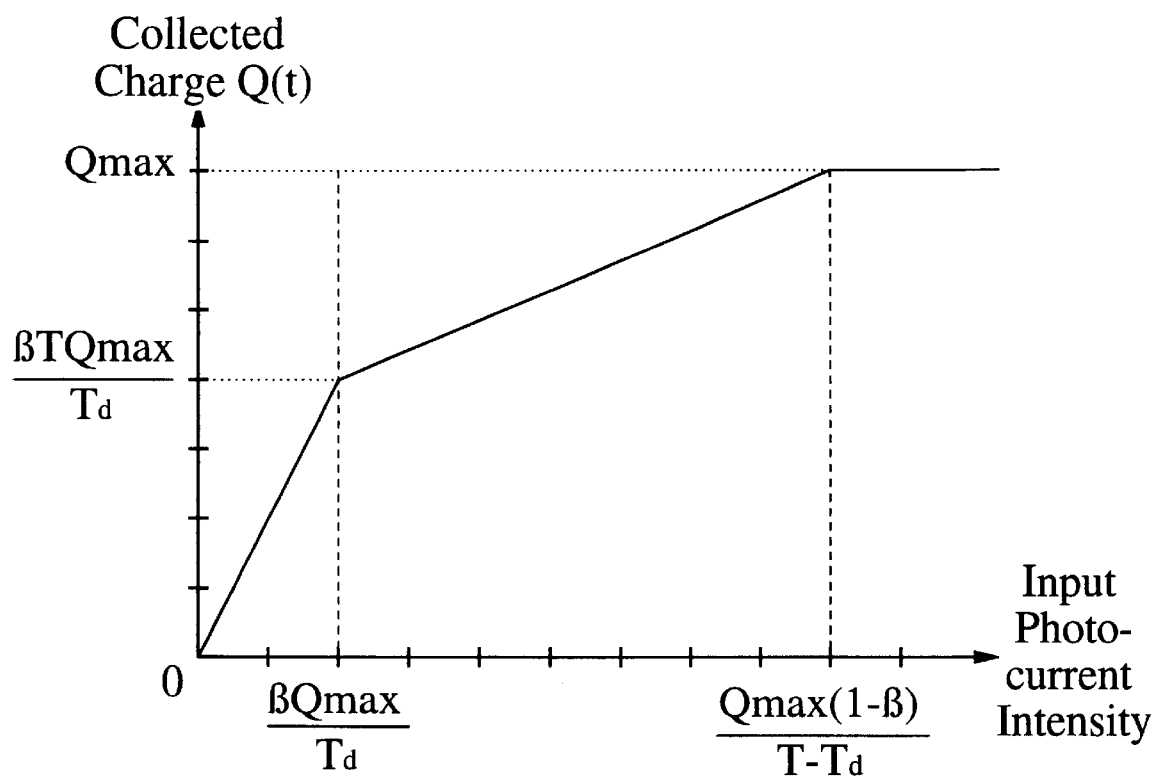
FIG. 5 is a plot of charge accumulation versus input photo-current for a sensor system using Temporary Capacity Saturation according to the prior art.

First, responsivity R is equal to q/C where q denotes the unit charge and C denotes the capacitance of integrating capacitor 18 in FIG. 1. If the capacitor is linear, then responsivity is a constant. If the capacitor is non-linear, e.g. a diffusion capacitor in an integrated circuit, then responsivity R varies, and hence relationships such as $S(T_2)=2S(T_1)$ and $S(T_3)=4S(T_1)$ are no longer valid. These relationships were used in the baseline FPBS ADC scheme described above. However, $T_1, T_2, T_3, \ldots T_M$ can be properly chosen so that the following relationships $S(T_2)=2S(T_1)$, $S(T_3)=4S(T_1)$, $\ldots S(T_M)=2^{M-1}S(T_1)$ remain valid. This is because $S(T)=\int I/C\, dt$ is a monotonic function, and therefore, its inverse $S^{-1}$ exists. So, if $S(T_M)$ is chosen as $S^{-1}[2^{M-1}(T_1)]$, then $S(T_M)=2^{M-1}S(T_1)$.

Second, considering the linearity of the input light intensity, I, we have two scenarios. For some digital still/low speed applications where the light input does not change during the course of a single analog-to-digital conversion cycle, a constant input I is valid, and the baseline scheme described above is adequate. Moreover, the FPBS ADC's wide dynamic range is most beneficial for digital still applications. In the other scenario where the input light changes during the analog-to-digital conversion cycle, the final digital codeword does not deviate much from the "true value" (an average value anyway) because the floating-point ADC generates the most significant bits first. Also, the baseline scheme can be modified to generate accurate results. There are a variety of ways to do this.

In the first technique, instead of simply combining/suffixing the bits obtained in subsequent sub-conversions, additional digital logic can be used to convert the bits from all the sub-conversions to a final, cumulative digital word. In another technique, when the analog input signals change very fast, the FPBS ADC might need to sub-convert more often, and each sub-conversion can generate more than one bit. Sub-conversion can be done between the regular $T_1$, $T_2, \ldots T_M$ sub-conversion times. Again, additional digital logic can be used to convert the bits from all the sub-conversions into a final, cumulative digital output. The conversion is based on "tracing" out the trajectory of S(t).

Many extensions to the baseline scheme exist, and the method of the present invention is very flexible on what the sub-conversion times are and what to obtain at each sub-conversion time. For example, suppose a scene contains a bright region (e.g. outdoors under bright sunlight) and a dark region (e.g. indoors under normal room lighting). If we know that the bright region has 16 times the illumination of the dark region, then the FPBS ADC can be made to skip over the sub-conversions at $T_2$ and $T_3$, and instead sub-convert only at $T_1$ and then at $T_4, T_5, \ldots T_M$ directly. A similar procedure can be carried out if floating-point data with variable mantissa resolution is desired.

FPBS ADC for CMOS Area Image Sensors

The embodiment of a FPBS ADC according to the present invention is ideally suited for performing analog-to-digital conversion in CMOS area image sensors at either the individual pixel level or where the ADC is multiplexed among a group of neighboring pixels. This not only retains all the advantages of pixel level analog-to-digital conversion (as described in U.S. Pat. No. 5,461,425 by Fowler et. al.) such as small circuit area and robust circuitry, but it also overcomes the problem of generating too much data from over-sampled analog-to-digital techniques such as from the technique described in the above-mentioned patent by Fowler et al.

Figure 10:
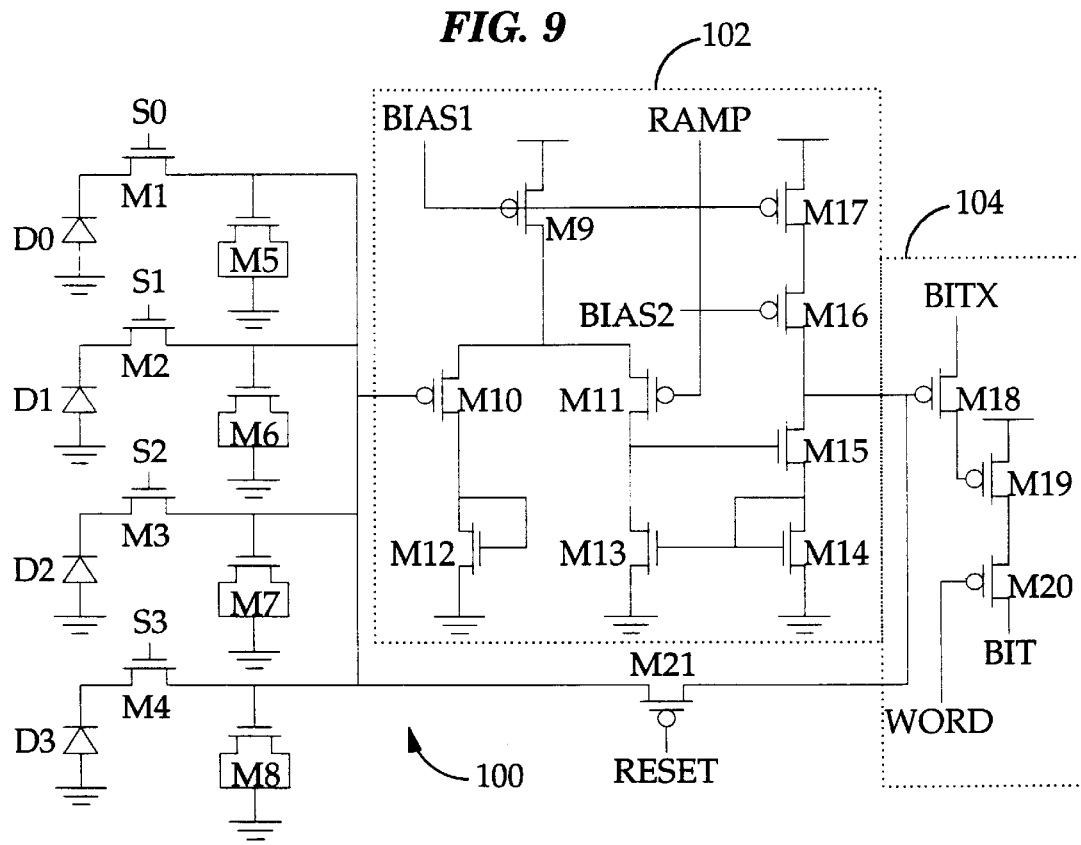
FIG. 10 illustrates circuitry according to one embodiment of the present invention for performing analog-to-digital conversion within an image sensor array where a comparator and a latch in an analog-to-digital converter are associated with four photodetectors in the image sensor array, with global circuitry being located outside the array.
Figure 11:
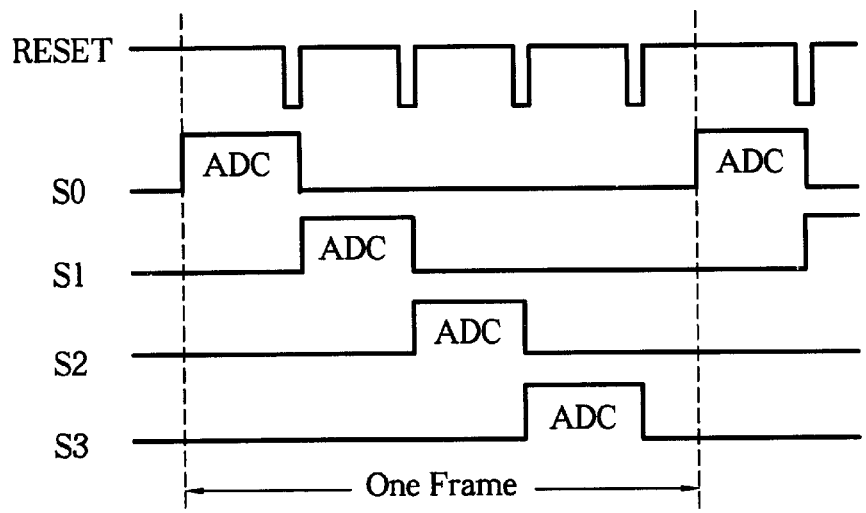
FIG. 11 illustrates the reset and multiplexer select control signals for performing one frame of analog-to-digital conversion in an embodiment of the present invention.

A schematic diagram of circuitry that implements an image sensor pixel cell in a standard digital CMOS process using FPBS ADC for floating-point conversion according to the present invention is shown in FIG. 10. Using multiplexing techniques described below, this circuit performs FPBS conversion on four nearest-neighbor pixels. In the circuit, each pixel uses a photodiode D0–D3 as a photodetector, and MOS transistors M5–M8 are used as capacitors to integrate the photodetector analog signals. The FPBS ADC circuitry is shared among the four nearest neighbor pixels, and analog-to-digital conversion is performed on the analog signal from each photodetector in sequence according to multiplexer select control signals S0–S3, which are illustrated in FIG. 11. The multiplexer select control signals S0–S3 are analog signals which, when activated, bias the corresponding pass transistors M1–M4 such that they serve as common gate amplifiers to effectively buffer the output of photodetectors D0–D3 from the voltages that appear on integrating capacitors M5–M8. Thus, the multiplexer switches M1–M4 serve as current switches when activated and bias the photodetectors into direct injection mode. The direct injection mode keeps the photodetector bias relatively constant and helps maintain a linear response from the photodetector as it supplies an integration current during each full conversion cycle (i.e. when the corresponding multiplexer select control signal is high).

Figure 12:
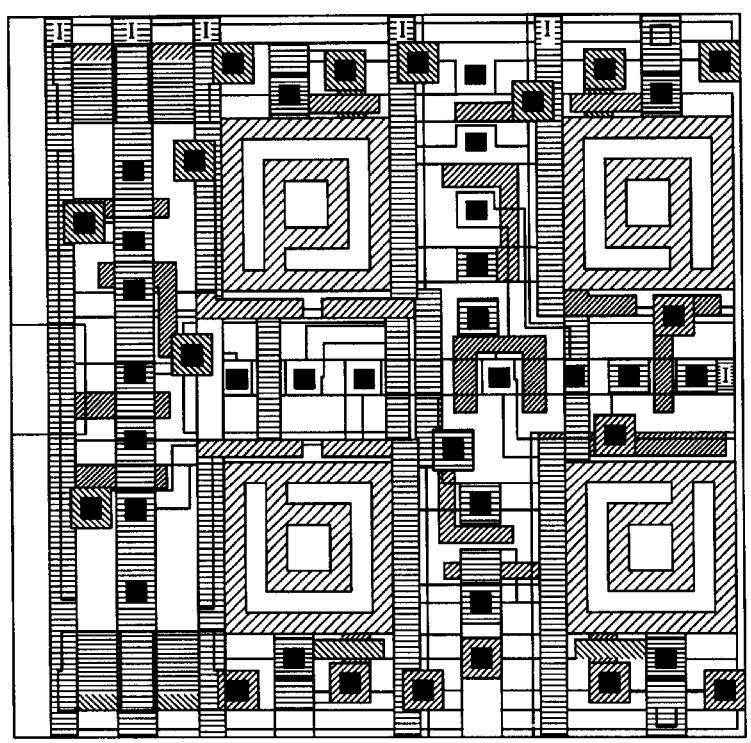
FIG. 12 illustrates a layout of a single 2×2 pixel cell of circuitry according to one embodiment of the present invention for performing analog-to-digital conversion within an image sensor array where a comparator and a latch in an analog-to-digital converter are associated with four photodetectors in the image sensor array, with global circuitry being located outside the array.

The FPBS ADC circuitry 100 consists of a comparator 102 and a one-bit dynamic latch 104. Comparator 102 consists of a transconductance stage and a cascode amplifier stage as are well understood by those skilled in the art. It is nominally biased under subthreshold conditions to maximize gain and minimize power. Dynamic latch 104 acts as a 2T DRAM cell, which is also understood by those skilled in the art, where MOS transistor M18 is the pass transistor (write port) and MOS transistor M19 is the output buffer (read port). MOS transistor M20 is an access transistor. Offset correction and correlated double sampling is achieved through auto-zeroing, where the offset values are stored on the photodiode capacitors by briefly turning on a feedback path via reset transistor M21. The offset correction circuitry can be removed if external digital correction is employed. FPBS ADC 100 uses 21 transistors for four pixels, resulting in an average of five transistors per pixel. FIG. 12 shows a layout of a 2×2 pixel cell including the four photodiodes D0–D3 and the shared FPBS ADC 100 circuitry.

FIG. 11 depicts the waveforms of the control signals S0–S3 used to generate one frame of an image. Because of multiplexing, four quarter frames of an image, each corresponding to one of the four photodetectors in each pixel cell, are generated to compose one frame.

One feature of FPBS ADC 100 when used in an image sensor is that most of the complex circuitry is shared among all pixels, and hence non-uniformity of pixels caused by the ADC comes from only two places: variation in analog switch feed-through and comparator offset. These two sources of offset are reduced using any offset correction technique such as auto-zeroing, which is used in the embodiment of FPBS ADC 100.

Figure 13:
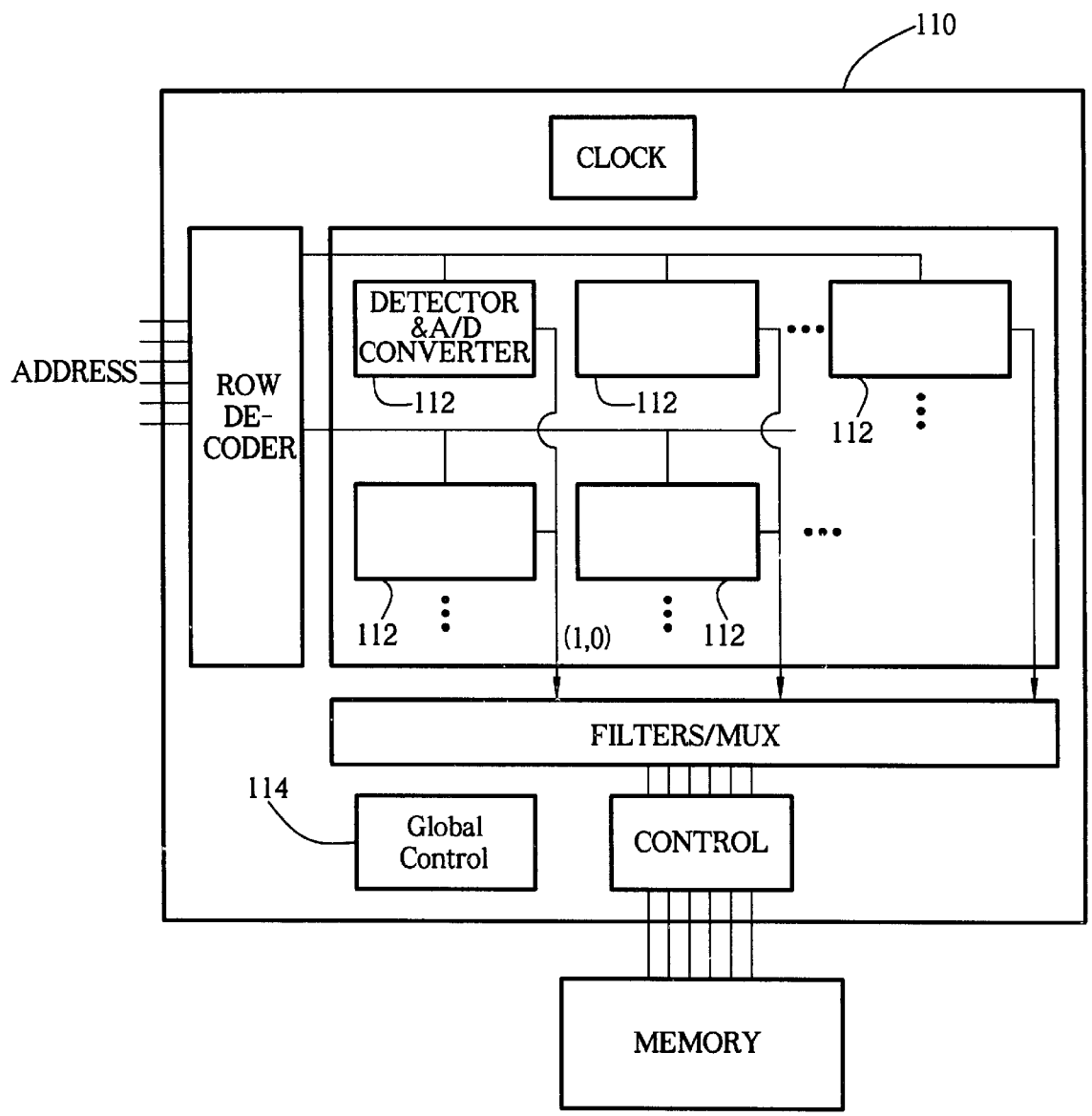
FIG. 13 illustrates an image sensor array formed as an integrated circuit where the channel specific portions of the analog-to-digital converters according to one embodiment of the present invention are located proximate to associated photodetectors in the image sensor array.

A block diagram of an integrated circuit containing an image sensor array having pixel level FPBS ADCs in the image sensor core is shown in FIG. 13. FIG. 13 is identical to FIG. 1 in U.S. Pat. No. 5,461,425 by Fowler et. al., except the ADCs in block 112, described in the patent by Fowler et. al. are replaced by the FPBS ADCs described herein, and a global circuitry block 114 is added for controlling the pixel level FPBS ADC portions in blocks 112. The description of FIG. 1 in U.S. Pat. No. 5,461,425 by Fowler et. al. is incorporated herein by reference, and will not be repeated. A single FPBS ADC may be integrated for each pixel or shared among a group of pixels.

Figure 14:
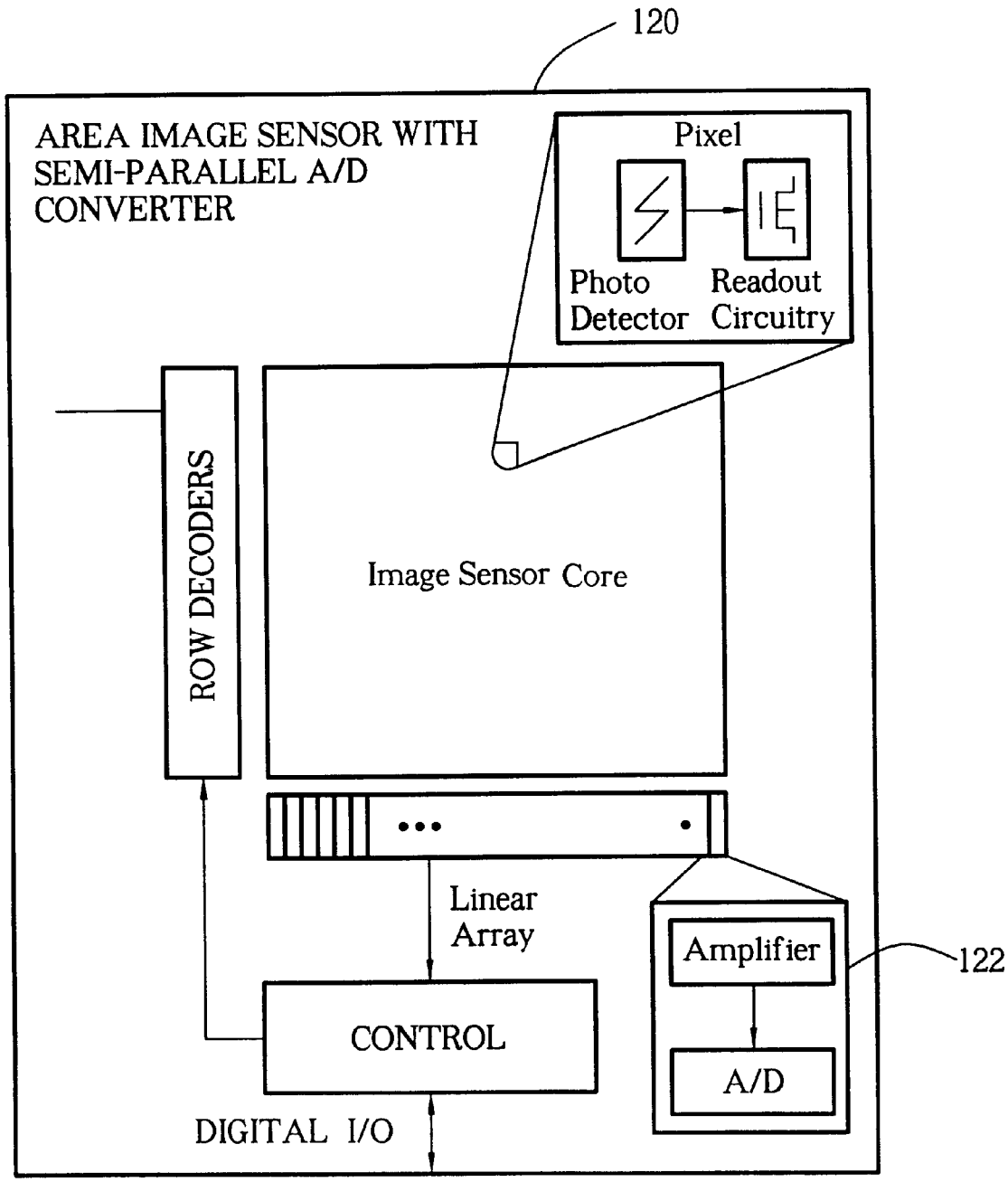
FIG. 14 illustrates an image sensor array formed as an integrated circuit where each column of photodetectors is associated with a single analog-to-digital converter located external to the image sensor array converter wherein the analog-to-digital converter is formed in accordance to one embodiment of the present invention.

Although we have discussed the FPBS ADC in the context of pixel level ADC, it can also be used in column level ADC, where the ADC is not located within the image sensor array. The only difficulty with this approach is the switching speed required by the comparator. At high video frame rates, the comparator in the FPBS ADC 122 must be very fast in order to keep up with the data. This is not a concern for still imaging or low frame rate video imaging. This approach is illustrated in FIG. 14. Each column of photodetectors applies its analog value to an associated FPBS ADC 122 formed in accordance with the present invention. The rows and columns of photodetectors are addressed to provide digital values of the photodetector outputs at the terminals of the integrated circuit. The remainder of the image sensor may be similar to that described in U.S. Pat. No. 5,461,425.

Many modifications of the FPBS ADC embodiment described herein are possible without exceeding the scope of the present invention, and many of these would be obvious to those skilled in the art. For example, the FPBS ADC could be constructed using bipolar transistors and a different circuit topology from that described in FIG. 10. Also, the FPBS ADC according to the present invention could be used in other applications besides light sensing. In addition, certain details of the present description can be changed in obvious ways without altering the function or results of the essential ideas of the invention. For example, wide dynamic range, floating-point, digital conversion according to the present invention could be implemented in other ways without using a FPBS ADC (e.g. using a standard N-bit flash ADC for N-bit conversion at each sub-conversion time). Also, sub-conversion could be performed at intervals such as $T_1$, $T_2=4T_1$, and $T_3=16T_1$, preserving 2-bits at each sub-conversion time and achieving the same effective results. Therefore, although the invention has been described in connection with a particular embodiment, it will be understood that this description is not intended to limit the invention thereto, but the invention is intended to cover all modifications and alternative constructions falling within the spirit and scope of the invention as expressed in the appended claims and their legal equivalents.

We claim:

1. A method for converting an analog signal to a cumulative digital representation using an analog-to-digital converter with an input dynamic range, the cumulative digital representation can have a dynamic range greater than the input dynamic range, the method comprising:

a) resetting said analog signal to a reference value at an initial time t=0;

b) sampling said analog signal at subsequent times $t=T_1>0$, $t=T_2>T$, $t=T_3>T_2$, ... $t=T_M>T_{M-1}$ while said analog signal is monotonically changing to produce respective digital representations; and c) suitably combining said respective digital representations into said cumulative digital representation.

2. The method according to claim 1 wherein said subsequent times are related by a multiplicative factor j such that $T_1>0$, $T_2=jT_1$, $T_3=jT_2=j^2T_1$, ... $T_M=jT_{M-1}=j^{M-1}T_1$.

3. The method according to claim 2 wherein said multiplicative factor j=2.

4. The method according to claim 1 wherein said cumulative digital representation is a cumulative, floating-point, digital representation.

5. The method according to claim 4 wherein said digital representations are N-bit binary numbers.

6. The method according to claim 5 wherein said N-bit binary numbers correspond to an N-bit Gray Code.

7. The method according to claim 6 wherein step c) of suitably combining said digital representations comprises: 1) appending the Nth (rightmost) bit of said digital representation corresponding to $T_2$ to the right of said digital representation corresponding to $T_1$ to form an N+1 bit intermediate digital representation, 2) appending the Nth (rightmost) bit of said digital representation corresponding to $T_3$ to the right of said intermediate digital representation to form a new intermediate digital representation, and 3) repeating step 2) for the Nth (rightmost) bit of said digital representations corresponding to $T_4, T_5, \ldots T_M$ until only an N+M−1 bit intermediate digital representation remains, said N+M−1 bit intermediate digital representation being said cumulative, floating-point, digital representation.

8. The method according to claim 7 wherein said analog signal is a photo-current from a photodetector.

9. A method for converting an analog signal to a cumulative digital representation having a dynamic range greater than $S_s/S_{min}$, the method comprising:

a) resetting said analog signal to a reference value at an initial time t=0;

b) sampling said analog signal at a first sub-conversion time $T_1>0$ while said analog signal is monotonically changing to produce a first digital representation of dynamic range less than or equal to $S_s/S_{min}$;

c) sampling said analog signal at a subsequent sub-conversion time $T_2>T_1$ while said analog signal is monotonically changing to produce a second digital representation of dynamic range less than or equal to $S_s/S_{min}$;

d) combining said first digital representation and said second digital representation into an intermediate digital representation that replaces said first digital representation;

e) repeating steps c) and d) at subsequent sub-conversion times $T_3>T_2$, $T_4>T_3$, ... $T_M>T_{M-1}$ while said analog signal is monotonically changing to obtain a final intermediate digital representation which is said cumulative digital representation.

10. The method according to claim 9 wherein said cumulative digital representation is a cumulative, floating-point, digital representation.

11. The method according to claim 10 wherein said sub-conversion times are related by a multiplicative factor j being j an integer such that $T_1>0$, $T_2=jT_1$, $T_3=jT_2=j^2T_1$, ... $T_M=jT_{M-1}=j^{M-1}T_1$.

12. The method according to claim 11 wherein said multiplicative factor j=2.

13. The method according to claim 12 wherein said first and second digital representations are N-bit binary numbers.

14. The method according to claim 13 wherein said N-bit binary numbers correspond to an N-bit Gray Code.

15. The method according to claim 14 wherein said combining of said first digital representation with said second digital representation involves appending the Nth (rightmost) bit of said second digital representation to the right of said first digital representation.

16. The method according to claim 14 wherein said producing of said second digital representation involves acquiring the Nth (rightmost) bit of the N-bit binary Gray Code number corresponding to said analog signal at said subsequent time.

17. The method according to claim 16 wherein said combining of said first digital representation with said second digital representation involves appending the Nth (rightmost) bit of said second digital representation to the right of said first digital representation.

18. The method according to claim 17 wherein said analog signal is a photo-current from a photodetector.

19. An analog-to-digital conversion circuit for converting an analog signal to a cumulative digital representation having a dynamic range greater than an input dynamic range of the analog-to-digital conversion circuit, the circuit comprising:

a) means for resetting said analog signal to a reference value at an initial time t=0;

b) a first signal generator for generating a first signal having a plurality of levels;

c) a comparator having a first input connected to receive said first signal and a second input connected to receive said analog signal;

d) a binary signal generator for generating a series of binary signals; and e) a latch having a first input coupled to receive an output of said comparator, said latch also having a data input coupled to receive said binary signals, said output of said comparator controlling when said latch provides an output signal corresponding to said binary signals applied to said data input, wherein said latch provides a first N-bit digital code representing said analog signal at a first sub-conversion time T1 >0, and wherein said latch provides at least a portion of subsequent N-bit digital codes representing said analog signal monotonically changing and sampled at subsequent sub-conversion times $T_2>T_1$, $T_3>T_2$, ... $T_M>T_{M-1}$, wherein a combination of said first N-bit digital code and said portions of said subsequent N-bit digital codes leads to said cumulative digital representation.

20. The analog-to-digital conversion circuit according to claim 19 wherein said cumulative digital representation is a cumulative, floating-point, digital representation.

21. The analog-to-digital conversion circuit according to claim 20 wherein said sub-conversion times are related by a multiplicative factor j being an integer such that $T_1>0$, $T_2=jT_1$, $T_3=jT_2=j^2T_1$, ... $T_M=jT_{M-1}=j^{M-1}T_1$.

22. The analog-to-digital conversion circuit according to claim 21 wherein said multiplicative factor j=2.

23. The analog-to-digital conversion circuit according to claim 22 wherein said N-bit digital codes correspond to an N-bit binary Gray Code.

24. The analog-to-digital conversion circuit according to claim 23 wherein said cumulative, floating point, digital representation is obtained by sequentially appending the Nth (rightmost) bit of said subsequent N-bit digital codes to the right of said first N-bit digital code.

25. The analog-to-digital conversion circuit according to claim 23 wherein said portion of said subsequent N-bit digital codes that is provided by said latch comprises only the Nth (rightmost) bit of said subsequent N-bit digital codes.

26. The analog-to-digital conversion circuit according to claim 25 wherein said cumulative, floating point, digital representation is obtained by sequentially appending the Nth (rightmost) bit of said subsequent N-bit digital codes to the right of said first N-bit digital code.

27. The analog-to-digital conversion circuit according to claim 26 wherein said analog signal is a photo-current from a photodetector.

28. The analog-to-digital conversion circuit according to claim 19 wherein said N-bit digital representations of said analog signal at said sub-conversion times have a dynamic range less than or equal to $S_s/S_{min}$.

29. The analog-to-digital conversion circuit according to claim 19 further comprising a sampling circuit connected to an output of said latch for outputting said output of said latch at an end of a bit time associated with a bit position of said N-bit digital code.

30. The analog-to-digital conversion circuit according to claim 19 wherein said first signal generator generates a series of signal levels that correspond to sub-intervals, said analog signal falling within one of said subintervals for each N-bit digital code.

31. The analog-to-digital conversion circuit according to claim 30 wherein one comparator and one latch are assigned to each of said photodetectors.

32. The analog-to-digital conversion circuit according to claim 30 wherein one comparator and one latch are associated with a group of photodetectors.

33. The analog-to-digital conversion circuit according to claim 19 further comprising an image sensor formed as an integrated circuit having a plurality of photodetectors, said photodetectors formed within an image sensor array, each of said photodetectors generating an analog signal, said comparator and said latch being formed within said image sensor array proximate to said photodetectors for converting said analog signal generated by at least one photodetector into a digital code, wherein said comparator is one of a plurality of comparators and said latch is one of a plurality of latches all formed within said image sensor array as part of a plurality of analog-to-digital converter circuits.

* * * * *